United States Patent [19]
Chen et al.

[11] Patent Number: 5,977,893
[45] Date of Patent: Nov. 2, 1999

[54] METHOD FOR TESTING CHARGE REDISTRIBUTION TYPE DIGITAL-TO-ANALOG AND ANALOG-TO-DIGITAL CONVERTERS

[75] Inventors: Jason Chen, Ilan; Henry Fan, Chung-Li, both of Taiwan

[73] Assignee: Holtek Semiconductor, Inc., Hsinchu, Taiwan

[21] Appl. No.: 08/844,170

[22] Filed: Apr. 18, 1997

[51] Int. Cl.$^6$ .................................................. H03M 1/10
[52] U.S. Cl. ........................... 341/120; 341/172; 324/677
[58] Field of Search .................... 324/677, 678, 324/679; 341/120, 150, 172

[56] References Cited

U.S. PATENT DOCUMENTS

| | | |
|---|---|---|
| 4,129,863 | 12/1978 | Gray et al. ........................... 341/172 |
| 4,198,622 | 4/1980 | Connolly, Jr. et al. .................. 341/144 |
| 5,654,708 | 8/1997 | Boehl et al. ............................. 341/120 |

*Primary Examiner*—Howard L. Williams
*Attorney, Agent, or Firm*—Tung & Associates

[57] ABSTRACT

A test method for charge redistribution type digital-to-analog and analog-to-digital converters by utilizing the special characteristics of a DAC or ADC such that the accuracy and linearity of the converted signal is only determined by the internal capacitance ratios of the converter, and that the accuracy and linearity are not related to the test reference voltage, the test voltage and the noise signal of the test machine. The test method utilizes a principle of capacitance comparison to directly compare the capacitance ratios in a converter in order to determine the accuracy and linearity of the converted signal. The present invention method enables an effective reduction in the test time and test steps required and an increase in the test efficiency.

12 Claims, 2 Drawing Sheets

METHOD FOR TESTING CHARGE REDISTRIBUTION TYPE DIGITAL-TO-ANALOG AND ANALOG-TO-DIGITAL CONVERTERS

FIELD OF THE INVENTION

The present invention generally relates to a method for testing charge redistribution type digital-to-analog and analog-to-digital converters and more specifically, relates to a test method for charge redistribution type digital-to-analog and analog-to-digital converters by utilizing a capacitance comparison method for comparing the capacitance ratios of the converters in order to test the accuracy and linearity of the converted signal.

BACKGROUND OF THE INVENTION

In the conventional testing methods for digital-to-analog converters (DAC) and analog-to-digital converters (ADC), an accurate reference voltage must be supplied to the analog signal for comparison, especially in high bit number converters. There is also a stringent requirement in the test voltage and the noise signal of the test machine. This leads to a long test time required and a complicated test procedure. In charge redistribution type DACs and ADCs, the internal circuit is mainly constructed of capacitors and the error and linearity of the converted signal are determined by the internal capacitance ratios. If a converter is tested by an input analog signal, it is not only time consuming but also produces low reliability. It is therefore an important requirement in large volume testing to reduce the test time and to simplify the test procedure.

It is therefore an object of the present invention to provide a test method for charge redistribution type digital-to-analog and analog-to-digital converters to determine the accuracy and linearity of the converted signal.

It is another object of the present invention to provide a test method for charge redistribution type digital-to-analog and analog-to-digital converters by using a capacitance comparison method to compare the capacitance ratios in the converter tested for obtaining the accuracy and linearity of the converted signal.

SUMMARY OF THE INVENTION

A test method for charge redistribution type digital-to-analog and analog-to-digital converters is provided which utilizes the special characteristics of the DAC or ADC such that the accuracy and the linearity of the converted signal are determined by the internal capacitance ratios of the converter, and are not related to the test reference voltage, the test voltage and the noise signal of the test machine. The test method utilizes the principle of capacitance comparison to directly compare the capacitance ratios in a converter in order to determine the accuracy and linearity of the converted signal. This enables an effective reduction in the test time and the test steps required and consequently, an increase in the test efficiency.

BRIEF DESCRIPTION OF THE DRAWINGS

Other objects, features and advantages of the present invention will become apparent upon consideration of the specification and the appended drawings in which.

DETAILED DESCRIPTION OF THE PREFERRED EMBODIMENT

A preferred embodiment of the present invention test method is described as follows. The present invention test method for charge redistribution type DAC and ADC utilizes the converter's own circuit with the addition of an external timing control circuit and a fixed ratio capacitor. By following the charging and discharging steps, it is determined whether the fixed ratio capacitor is within the necessary specification or not.

Figure 1:
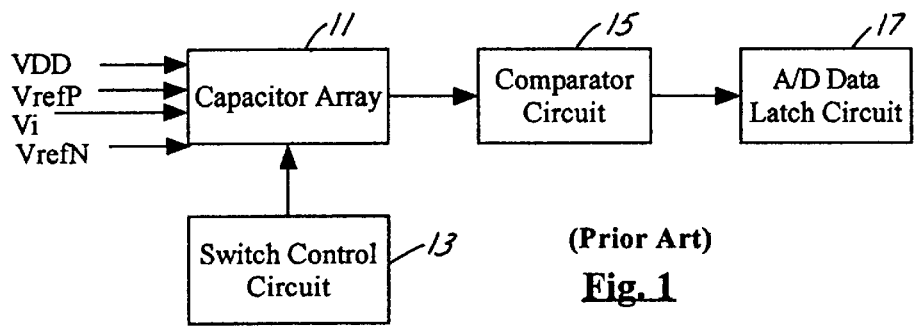
FIG. 1 is a functional block diagram of a charge redistribution type ADC.

The operation of an ADC can first be described. As shown in FIG. 1, a functional block diagram for a charge redistribution type ADC is shown. The charge redistribution type ADC consists of a capacitor array 11, a switching control circuit 13, a comparator circuit 15 and a data latch circuit 17. As shown in FIG. 1, VDD is the power source voltage, $V_i$ is the analog input voltage signal, $V_{ref}P$ and $V_{ref}N$ are the high and low reference voltage. The capacitor array 11 is constructed of a series of capacitors that has a ratio of ½ or a capacitor array that consists of N capacitors wherein the capacitance from large to small sequentially are:

$$2^n-1{*}C,\ 2^{n-2}{*}C,\ \ldots,\ 2^2{*}C,\ 2^1{*}C,\ 2^0{*}C$$

When the neighboring capacitor ratio of the capacitor array 11 is not ½, then conversion error and poor linearity would occur. The highest limit it can tolerate is the converter specification. The switch control circuit 13 first switches the analog input voltage signal $V_i$ and the reference voltages $V_{ref}P$ and $V_{ref}N$ to the capacitor array 11, and then charges and discharges each capacitor such that the charges on the capacitors are redistributed. The new terminal voltage obtained on the capacitors is supplied to the comparator circuit 15 for comparing the magnitude of the capacitance. The comparator circuit 15 consists of a series of CMOS amplifiers for determining whether the input voltage signal $V_i$ is larger than the conversion point voltage, and simultaneously storing the output data from the comparator circuit 15 into the data latch circuit 17 in a series manner. The output signals from the comparator circuit 15 have high and low potentials in a binary code format such that the data stored in the data latch circuit 17 is the digital signal to be obtained from the ADC converter.

In the comparator circuit 15, the conversion point voltage of the CMOS amplifier cannot be easily and accurately controlled at ½*VDD, wherein VDD is the power source voltage for use by the CMOS amplifier. When the comparator is used to compare the capacitance, it should have no relationship with the conversion point voltage so that the accuracy of comparison can be improved. The present invention method utilizes a precharge and discharge comparison method in order to achieve such objective.

Figure 2:
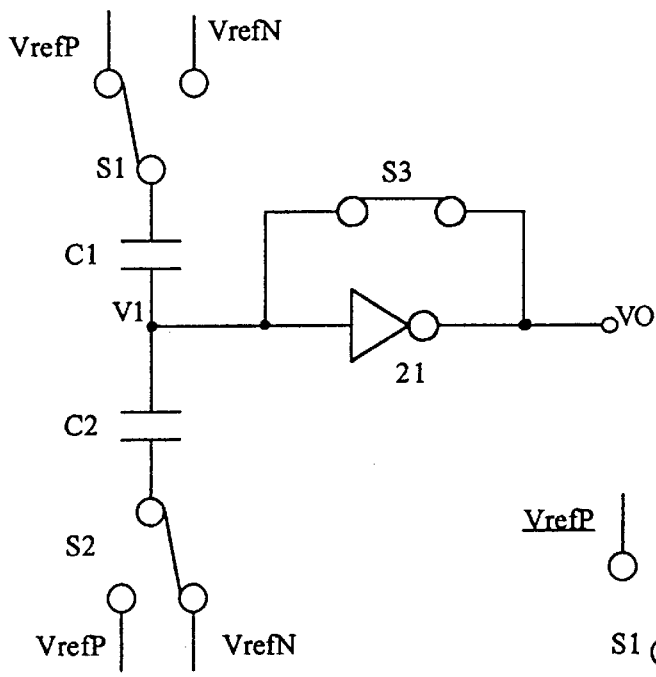
FIG. 2 is a schematic diagram of the present invention precharging circuit.

Referring now to FIG. 2, wherein a present invention precharging circuit is shown. The circuit includes capacitors $C_1$ and $C_2$, a CMOS amplifier 21, and switches $S_1$ and $S_2$ which are connected to power source $V_{ref}P$ and $V_{ref}N$, respectively and $V_{ref}P$ is larger than $V_{ref}N$. The switch $S_3$ in the feedback circuit of the CMOS amplifier 21 is closed. Assuming that the conversion point voltage is $V_1$ for the CMOS amplifier 21, then when in a stable condition, the voltage across capacitor $C_1$ is $V_{ref}P-V_1$, while the voltage across capacitor $C_2$ is $V_1-V_{ref}N$. The output terminal voltage $V_o$. is the conversion point voltage $V_1$ since switch $S_3$ is closed. The above describes the precharging steps.

Figure 3:
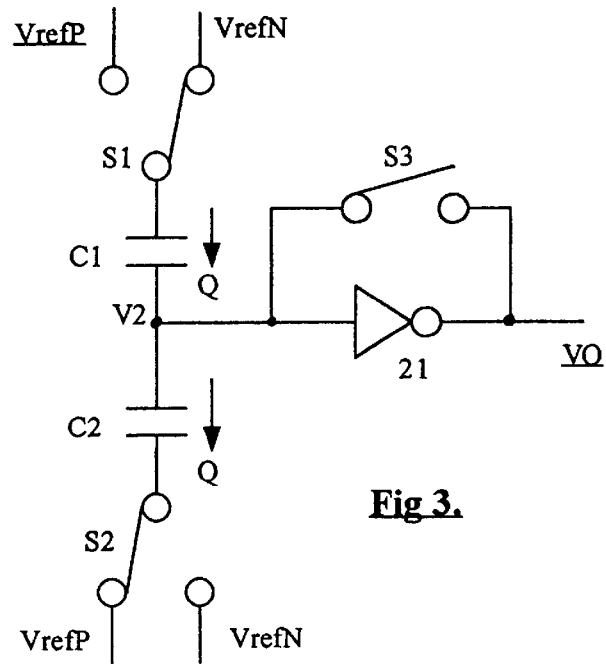
FIG. 3 is a schematic diagram of the present invention discharging circuit.

Referring now to FIG. 3, which shows a schematic diagram of the present invention discharging circuit. The switch $S_1$ has been switched from $V_{ref}P$ to $V_{ref}N$, while switch $S_2$ has been switched from $V_{ref}N$ to $V_{ref}P$. The power source for the originally connected precharging is reversely connected, and that switch $S_3$ in the feedback circuit of the CMOS amplifier 21 is opened. The charge distribution on the capacitors $C_1$ and $C_2$ is redistributed. The output terminal voltage $V_o$ of the CMOS amplifier 21 will also change according to the charge redistribution. Assuming that the variation in the charge on capacitors $C_1$ and $C_2$ is Q, then according to a steady state node voltage relationship, an expression for obtaining the variation in the charge can be obtained as follows:

$$-V_1 + V_{ref}N + Q/C_2 - V_{ref}P + V_1 + Q/C_1 = V_{ref}P - V_{ref}N$$

$$(C_1 + C_2)/C_1 C_2 * Q = 2*(V_{ref}P - V_{ref}N)$$

$$Q = 2*C_1*C_2*(V_{ref}P - V_{ref}N)/(C_1 + C_2)$$

Therefore, the voltage $V_2$ at the node of series connected capacitors $C_1$ and $C_2$ can be expressed as:

$$V_2 = V_{ref}N - V_{ref}P + V_1 + Q/C_1$$

$$= V_1 + (C_2 - C_1)/(C_1 + C_2) * (V_{ref}P - V_{ref}N)$$

or can be expressed as:

$$V_2 - V_1 = (C_2 - C_1)/(C_1 + C_2) * (V_{ref}P - V_{ref}N)$$

As indicated above, if $V_2 - V_1 > 0$, then $C_2 - C_1 > 0$. Since it is assumed in the present invention that $V_{ref}P > V_{ref}N$, if $V_2 - V_1 > 0$, then $C_2 - C_1 > 0$. Therefore, from the steady state voltage $V_2$ after charging and the steady state voltage $V_1$ after discharging, their magnitudes can be compared in order to first obtain a relationship between capacitors $C_1$ and $C_2$, and then outputting a corresponding output signal from the CMOS amplifier 21. In other words, when $C_2 > C_1$, the output terminal $V_o$ of the CMOS amplifier 21 is at a low electric potential. When $C_2 < C_1$, the output terminal $V_o$ of the CMOS amplifier 21 is at a high electric potential. These digital signals after being amplified by a backstage amplifier are stored into a data latch device.

Figure 4:
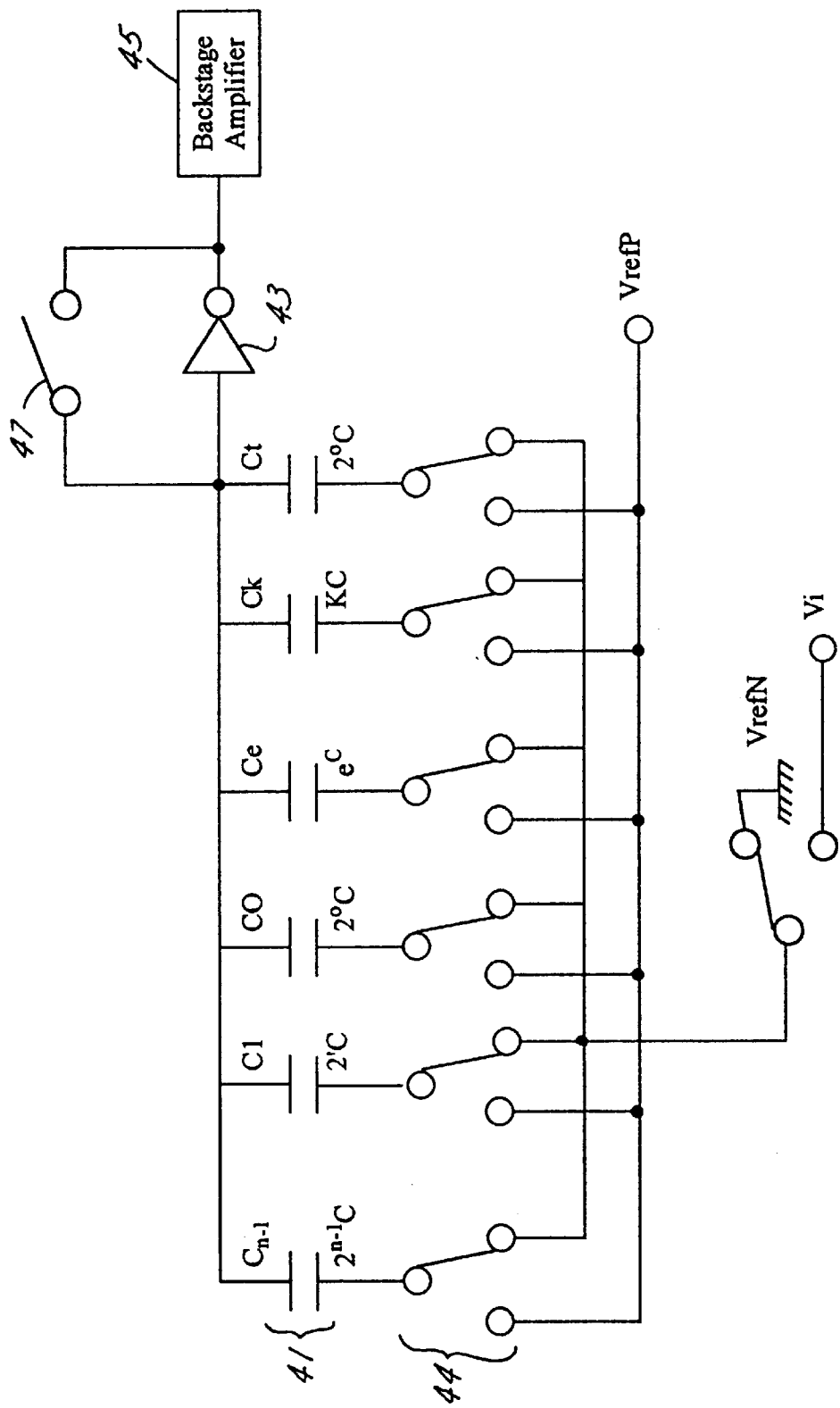
FIG. 4 is a schematic diagram of a connection between the present invention capacitance array and a CMOS amplifier.

Referring now to FIG. 4, wherein the present invention capacitor array connected to a CMOS amplifier is shown. The internal structure of an N bit ADC is illustrated which includes a series of capacitors 41, a series of switches 44, a CMOS amplifier 43, a switch 47, and a backstage amplifier 45. The series of switches 44 includes N switches capable of switching individually to $V_{ref}P$ or $V_{ref}N$ determined by the switch control circuit 13 of FIG. 1. This enables that during each switching, there are two sets of capacitors as shown in FIGS. 2 and 3 while each set consists of capacitor 41 which charges or discharges based on the switching state of the switch 47, and then comparing the magnitude of the two sets of capacitors. By suitably arranging the switch control circuit 13 of FIG. 1 such that during each charge and discharge, the two sets of capacitors consist of different capacitors 41 so that the relative magnitude of each capacitor can be compared sequentially. A corresponding output voltage Vo is obtained from the CMOS amplifier 43 and then the signal is magnified by the backstage amplifier 45 such that it can be stored into the data latch circuit of FIG. 1 for determining whether the ADC is within specification.

The capacitor 41 which forms the capacitor array includes capacitors $C_0$, $C_1$, ... $C_{n-1}$, $C_e$, $C_k$, and $C_t$, wherein $C_0 = 2^0*C$, $C_1 = 2^1*C$, $C_2 = 2^2*C$, ..., $C_{n-1} = 2^{n-1}*C$. C is a reference capacitance. The shift capacitor $C_k$ shifts the conversion point of each conversion value. The capacitance value is k*C. The test capacitance $C_e$ is the test specification capacitance during a high volume testing. It has a capacitance value of k*C. If the shift capacitance $C_k$ and the test capacitance $C_e$ are the same, then the two can be used together. In other words, if the shift capacitance $C_k$ and the testing capacitance $C_e$ are both 1*C, then k=1 and e=0 which can be used together. If the shift capacitance $C_k$ is 1*C, the test capacitance $C_e$ is 2*C, then k=1 and e=1 or k+e=2 can be used for testing.

The need for Ct, as shown in FIG. 4, depends on the conversion method of the ADC. For instance, when the conversion point voltage is:

$$(N+0.5*k)/2^n * (V_{ref}P - V_{ref}N), \text{ where } N = 0, 1, \ldots, 2^n - 2$$

then $C_t$ is necessary. However, when the conversion point voltage is:

$$(N+0.5*k)/(2^n - 1) * (V_{ref}P - V_{ref}N),$$

wherein $N = 0, 1, \ldots, 2^n - 2$, then $C_t$ is not necessary.

The comparison sequence of the capacitor array includes step 1 through step (2*n−2) for comparing the magnitude of two corresponding capacitors. This is shown as below:

| step (1) | compare $C_{n-1} + C_e + C_k$ and $C_{n-2} + \ldots + C_1 + C_0 + C_t$ |
|---|---|
| step (2) | compare $C_{n-2} + C_e + C_k$ and $C_{n-3} + \ldots + C_1 + C_0 + C_t$ |
| step (3) | compare $C_{n-3} + C_e + C_k$ and $C_{n-4} + \ldots + C_1 + C_0 + C_t$ |
| . | |
| . | |
| step (n − 1) | compare $C_1 + C_e + C_k$ and $C_0 + C_t$ |
| step (n) | compare $C_{n-1}$ and $C_{n-2} + \ldots + C_1 + C_0 + C_t + C_e + C_k$ |
| step (n + 1) | compare $C_{n-2}$ and $C_{n-3} + \ldots + C_1 + C_0 + C_t + C_e + C_k$ |
| step (n + 2) | compare $C_{n-3}$ and $C_{n-4} + \ldots + C_1 + C_0 + C_t + C_e + C_k$ |
| . | |
| . | |
| step (2*n − 2) | compare $C_1$ and $C_0 + C_t + C_e + C_k$ |

Wherein step (1) through step (n−1) is the first sequence comparison, while step (n) to step (2*n−2) is the second sequence comparison.

step (1) and step (n) can produce $$C_{n-1} - C_e - C_k < C_{n-2} + \ldots + C_1 + C_o + C_t < C_{n-1} + C_e + C_k$$

step (2) and step (n+1) can produce $$C_{n-2} - C_e - C_k < C_{n-3} + \ldots + C_1 + C_o + C_t < C_{n-2} + C_e + C_k$$

step (3) and step (n+2) can produce $$C_{n-3} - C_e - C_k < C_{n-4} + \ldots + C_1 + C_o + C_t < C_{n-3} + C_e + C_k$$

step (n−1) and step (2*n−2) can produce $$C_1 - C_e - C_k < C_o + C_t < C_1 + C_e + C_k$$

From the above obtained ADC conversion comparison points to sort into the following data and then multiplying with $V_{ref}P - V_{ref}N$:

in step (1) and step (n)

$$\frac{C_{n-1} - C_e - C_k}{C_{n-1} + \ldots + C_1 + C_o + C_t} \text{ and } \frac{C_{n-1} + C_e + C_k}{C_{n-1} + \ldots + C_1 + C_o + C_t}$$

in step (2) and step (n + 1):

$$\frac{C_{n-2} - C_e - C_k}{C_{n-1} \ldots + C_1 + C_o + C_t} \text{ and } \frac{C_{n-2} + C_e + C_k}{C_{n-1} + \ldots + C_1 + C_o + C_t}$$

in step (3) and step (n + 2):

$$\frac{C_{n-3} - C_e - C_k}{C_{n-1} + \ldots + C_1 + C_o + C_t} \text{ and } \frac{C_{n-3} + C_e + C_k}{C_{n-1} + \ldots + C_1 + C_o + C_t}$$

in step (n − 1) and step (2 ∗ n − 2):

$$\frac{C_o - C_e - C_k}{C_{n-1} + \ldots + C_1 = C_o + C_t} \text{ and } \frac{C_o + C_e + C_k}{C_{n-1} + \ldots + C_1 + C_o + C_t}$$

The above are the digital conversion points between 0 and $2^{n-1}-1$. For the digital conversion point larger than $2^{n-1}-1$, the value of the digital conversion point between 0 to $2^{n-1}-1$ corresponds to values after direct compression or magnification. Therefore, the digital value conversion point between 0 and $2^{n-1}-1$ includes the digital value conversion point of larger than $2^{n-1}-1$. The conversion characteristics of the ADC can be obtained by a comparison operation between step 1 and step (2*n−2).

Similarly, the above capacitor comparison method can be used in the testing of a charge redistribution type DAC. Since the converter mainly consists of a capacitor array, the accuracy and linearity of conversion are determined by the capacitance ratio of the capacitor array.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A test method for a charge redistribution type digital-to-analog and analog-to-digital converters wherein the accuracy and the linearity of the converted signal can be determined by the ratio of the internal capacitors of the converter, comprising the steps of:
   a. applying two charging voltages to the two terminal points of two sets of series connected capacitors for which the capacitance are to be compared, respectively and simultaneously closing a switch on a feedback circuit of a CMOS amplifier, said two sets of series connected capacitors are combined based on comparison steps, said combination having structural units including a set of equal ratio array of capacitors from the converter, a testing capacitor, a shift capacitor, and a conversion capacitor,
   b. reversing the voltage connections to said two sets of series connected capacitors to force said two sets of capacitors to discharge, and simultaneously opening the switch on the feedback circuit of the CMOS amplifier to form an open circuit, and
   c. comparing a stable voltage at the output terminal of the CMOS amplifier with a stable voltage at the output terminal of the CMOS amplifier in step (a) and determining which one of the two sets of capacitors has a higher capacitance.

2. A test method according to claim 1, wherein a CMOS amplifier is connected to the connecting point of said two sets of series connected capacitors with a switch in a feedback circuit of the CMOS amplifier in a closed position such that when in a stable condition, the connecting point voltage of said two capacitors is the same as the converting point voltage of said feedback circuit CMOS amplifier.

3. A test method according to claim 1, wherein when the charges on said two sets of capacitors is redistributed during a discharge such that in a stable condition, the connecting point voltage of the two capacitors achieves a new value, and the difference between the new value and the stable voltage of the precharging step is proportional to the capacitance difference of said two sets of capacitors.

4. A test method according to claim 1, wherein the magnitude of the connecting point stabilized voltage of the two capacitors after discharging and the stabilized voltage after charging are used to determine which of said two sets of capacitors has a higher capacitance.

5. A test method according to claim 1, wherein said two charging voltages being applied to the connecting point of said two series connected capacitors are a high potential voltage and a low potential voltage.

6. A test method according to claim 5, wherein the connection method in said series connected capacitors for said high potential voltage and said low potential voltage further comprises an inverse connection.

7. A test method according to claim 1 suitable for use in a charge redistribution type digital-to-analog converter.

8. A test method according to claim 1, wherein a smallest capacitance of said equal ratio array of capacitors is used as a reference capacitance and said value of the test capacitance is 2 to the exponential power of the reference capacitance such as $2^0$, $2^1$, $2^2$, . . . etc.

9. A test method according to claim 1, wherein the value of said shift capacitance is a whole number times said reference capacitance.

10. A test method according to claim 1, wherein the value of said conversion capacitance is the same as the reference capacitance.

11. A test method according to claim 1, wherein when said conversion capacitance to a N bit converter at its conversion point is $(N+0.5*k)/2^{n}*(V_{ref}P-V_{ref}N)$, wherein N=0, 1, . . . $2^{n-2}-2$, then the conversion capacitance is needed, wherein k is the ratio between the shift capacitance and the reference capacitance, $V_{ref}P$ and $V_{ref}N$ are the charging voltages for the high potential and the low potential, respectively.

12. A test method according to claim 1, wherein when said conversion point voltage is $(N+0.5*k)/(2^{n-1})*(V_{ref}P-V_{ref}N)$, wherein N=0, 1, . . . $2^n$, then there is no need for said conversion capacitance, wherein k is the ratio between the shift capacitance and the reference capacitance, $V_{ref}P$ and $V_{ref}N$ are the charging voltages for the high potential and the low potential, respectively.

* * * * *